United States Patent
He et al.

(10) Patent No.: US 12,212,281 B2
(45) Date of Patent: Jan. 28, 2025

(54) PHOTOVOLTAIC DETECTION ASSEMBLY

(71) Applicant: SLENERGY TECHNOLOGY (A.H.) CO., LTD., Chuzhou (CN)

(72) Inventors: Cheng He, Chuzhou (CN); YuYao Dai, Chuzhou (CN)

(73) Assignee: SLENERGY TECHNOLOGY (A.H.) CO., LTD., Chuzhou (CN)

( * ) Notice: Subject to any disclaimer, the term of this patent is extended or adjusted under 35 U.S.C. 154(b) by 141 days.

(21) Appl. No.: 17/993,810

(22) Filed: Nov. 23, 2022

(65) Prior Publication Data
US 2023/0378907 A1 Nov. 23, 2023

(30) Foreign Application Priority Data
May 18, 2022 (CN) .......................... 202210537757.9

(51) Int. Cl.
*H02S 50/00* (2014.01)
*G01R 15/20* (2006.01)
*G01R 19/00* (2006.01)

(52) U.S. Cl.
CPC .......... *H02S 50/00* (2013.01); *G01R 19/0092* (2013.01); *G01R 15/202* (2013.01)

(58) Field of Classification Search
CPC ... H02S 50/00; G01R 19/0092; G01R 15/202; G01R 31/52
USPC ........ 324/126, 761.01, 76.11, 500, 600, 691, 324/430, 434
See application file for complete search history.

(56) References Cited

U.S. PATENT DOCUMENTS

| | | | |
|---|---|---|---|
| 9,063,184 B2 | 6/2015 | Carpenter et al. | |
| 2003/0062078 A1* | 4/2003 | Mimura | H01L 31/044 136/244 |
| 2012/0235636 A1* | 9/2012 | Partovi | H02J 7/0042 320/108 |
| 2016/0116506 A1* | 4/2016 | Ringsrud | G01R 15/205 324/252 |
| 2018/0234051 A1* | 8/2018 | Ni | H02S 40/38 |
| 2019/0363673 A1* | 11/2019 | Li | H02S 50/10 |

(Continued)

FOREIGN PATENT DOCUMENTS

| | | |
|---|---|---|
| CN | 103986416 A | 8/2014 |
| CN | 210157148 U | 3/2020 |

(Continued)

*Primary Examiner* — Alexander Satanovsky
*Assistant Examiner* — Trung Q Nguyen
(74) *Attorney, Agent, or Firm* — Birch, Stewart, Kolasch & Birch, LLP

(57) ABSTRACT

A photovoltaic detection assembly includes a magnetic component and a detection component. The magnetic component includes a magnetic ring and a coil winding around the magnetic ring. The magnetic ring is sleeved on the cable and comprises an opening. Two end surfaces of the magnetic ring are disposed on two sides of the opening. The two end surfaces of the magnetic ring are arranged in parallel. The detection component comprises a Hall element, a detection module, a control module, a signal module, and a power module. The Hall element is disposed at the opening. The detection module is electrically connected to the Hall element. The control module is electrically connected to the detection module, the signal module, and the power module respectively. The power module is electrically connected to the coil.

10 Claims, 10 Drawing Sheets

(56) References Cited

U.S. PATENT DOCUMENTS

2020/0186050 A1* 6/2020 Yang ............... H02M 7/217
2022/0311234 A1* 9/2022 Rivers ............... H02H 3/32

FOREIGN PATENT DOCUMENTS

TW  201608246 A  3/2016
TW  201625965 A  7/2016

* cited by examiner

PHOTOVOLTAIC DETECTION ASSEMBLY

CROSS-REFERENCE TO RELATED APPLICATION

This application claims the priority benefit of Chinese Patent Application Serial Number 202210537757.9, filed on May 18, 2022, the full disclosure of which is incorporated herein by reference.

BACKGROUND

Technical Field

The present disclosure relates to the technical field of photovoltaic technology, particularly to a photovoltaic detection assembly for photovoltaic cables.

Related Art

In the photovoltaic industry, photovoltaic power generation is a technology that directly converts light energy into electrical power by utilizing photovoltaic effect of semiconductor interface. A key element of this technology is the solar cell. When the solar cells are connected in series, they can be encapsulated and protected to form a large-area solar cell module. A solar cell panel comprising one or more solar cell modules is called a photovoltaic module, which could cooperate with power controller and other components to form a photovoltaic power generation device. However, due to the considerably large area of the solar cell module, when the solar cell module of the photovoltaic power generation device fails, it is necessary to search for the fault location in a wide range before the targeted fault repair can be carried out. Thus, it takes a lot of time for detection, maintaining, and repairing, which is unfavorable for the development of the industry.

SUMMARY

The embodiments of the present disclosure provide a photovoltaic detection assembly assembled and disposed at the photovoltaic cables connected in series with respective solar cell modules so that the photovoltaic detection assembly could monitor the photovoltaic cables of the respective solar cell modules in real-time. Meanwhile, the photovoltaic detection assembly could detect and report detection information and detection position through autonomous power supply operation. Thus, the efficiency issue for detection and maintenance could be effectively solved.

The present disclosure provides a photovoltaic detection assembly disposed at a cable, comprising a magnetic component and a detection component. The magnetic component comprises a magnetic ring and a coil winding around the magnetic ring. The magnetic ring is sleeved on the cable and comprises an opening. The detection component comprises a Hall element, a detection module, a control module, a signal module, and a power module. The Hall element is disposed at the opening. The detection module is electrically connected to the Hall element. The control module is electrically connected to the detection module, the signal module, and the power module, respectively. The power module is electrically connected to the coil.

In one embodiment, the power module comprises a management unit and a battery unit. The management unit is electrically connected to the coil and the battery unit respectively.

The present disclosure provides a photovoltaic detection assembly disposed at a cable, comprising a magnetic component and a detection component. The magnetic component comprises a magnetic ring and a coil winding around the magnetic ring. The magnetic ring is sleeved on the cable and comprises an opening. The detection component comprises a Hall element, a detection module, a control module, a signal module, and a power module. The Hall element is disposed at the opening. The detection module is electrically connected to the Hall element. The control module is electrically connected to the detection module, the signal module, the power module, and the coil.

In one embodiment, the power module comprises a management unit and a battery unit. The management unit is electrically connected to the battery unit and the control module respectively.

In one embodiment, the photovoltaic detection assembly further comprises a housing sleeved on the cable. The magnetic component and the detection component are disposed in the housing.

The present disclosure provides a photovoltaic detection assembly disposed at a cable, comprising a first magnetic component, a detection component, and a second magnetic component. The first magnetic component comprises a first magnetic ring and a first coil winding around the first magnetic ring. The first magnetic ring is sleeved on the cable and comprises an opening. The detection component comprises a Hall element, a detection module, a control module, a signal module, and a power module. The Hall element is disposed at the opening. The detection module is electrically connected to the Hall element. The control module is electrically connected to the detection module, the signal module, the power module, and the first coil respectively. The second magnetic component comprises a second magnetic ring and a second coil winding around the second magnetic ring. The second magnetic ring is sleeved on the cable. The power module is electrically connected to the second coil.

In one embodiment, the photovoltaic detection assembly further comprises a third magnetic component and an auxiliary detection component. The third magnetic component comprises a third magnetic ring and a third coil winding around the third magnetic ring. The third magnetic ring is sleeved on the cable and comprises an opening. The auxiliary detection component comprises an auxiliary Hall element and an auxiliary detection module. The auxiliary Hall element is disposed at the opening of the third magnetic ring. The auxiliary detection module is electrically connected to the auxiliary Hall element. The control module is electrically connected to the auxiliary detection module.

In one embodiment, the power module comprises a management unit and a battery unit. The management unit is electrically connected to the second coil and the battery unit respectively.

In one embodiment, the photovoltaic detection assembly further comprises a housing sleeved on the cable. The first magnetic component, the detection component, and the second magnetic component are disposed in the housing.

In one embodiment, the detection module comprises a wave filtering unit, an amplifying circuit unit, and a signal converting unit. The wave filtering unit is electrically connected to the Hall element. The amplifying circuit unit is electrically connected to the wave filtering unit. The signal converting unit is electrically connected to the amplifying circuit unit. The control module is electrically connected to the signal converting unit.

In one embodiment, the signal module is used for wireless signal transmission, where the wireless signal communication takes at least one of the methods of WI-FI communication, Bluetooth communication, ANT communication, RF4CE communication, Zigbee communication, NFC communication, UWB communication and infrared communication.

In the embodiments of the present disclosure, by providing a photovoltaic detection assembly having a design in a combination of magnetic component and detection component, which can be referred as a Hall sensor to detect related electric current data in the cable. Besides, the magnetic component can perform charging by electric current magnetic effect and electromagnetic induction by the electric current in the cable for supplying electric energy for the automatic operation for the detection component. Thus, the photovoltaic detection assembly could provide real-time monitoring and reporting of detection results, as well as the functions of autonomous power supply for detection operations.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
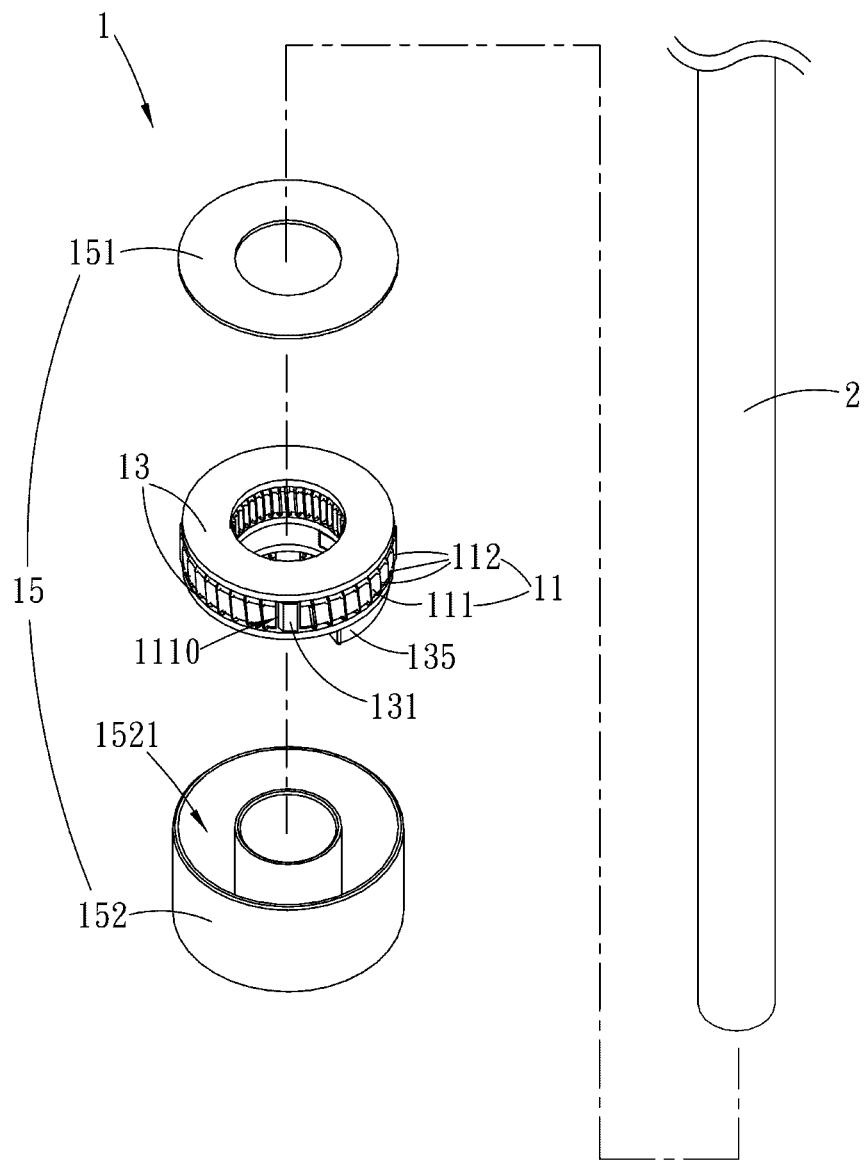
FIG. 1 is a perspective view of a photovoltaic detection assembly of the first embodiment of the present disclosure.
Figure 2:
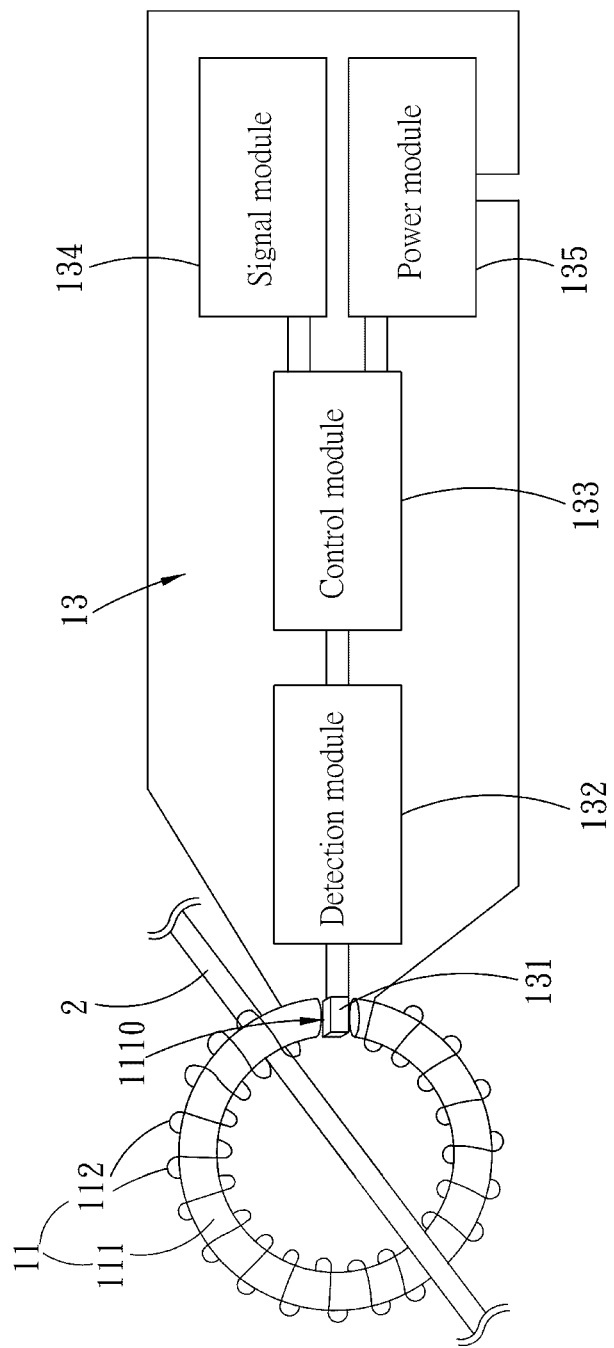
FIG. 2 is a schematic diagram of a circuit module of the first embodiment of the present disclosure.
Figure 3:
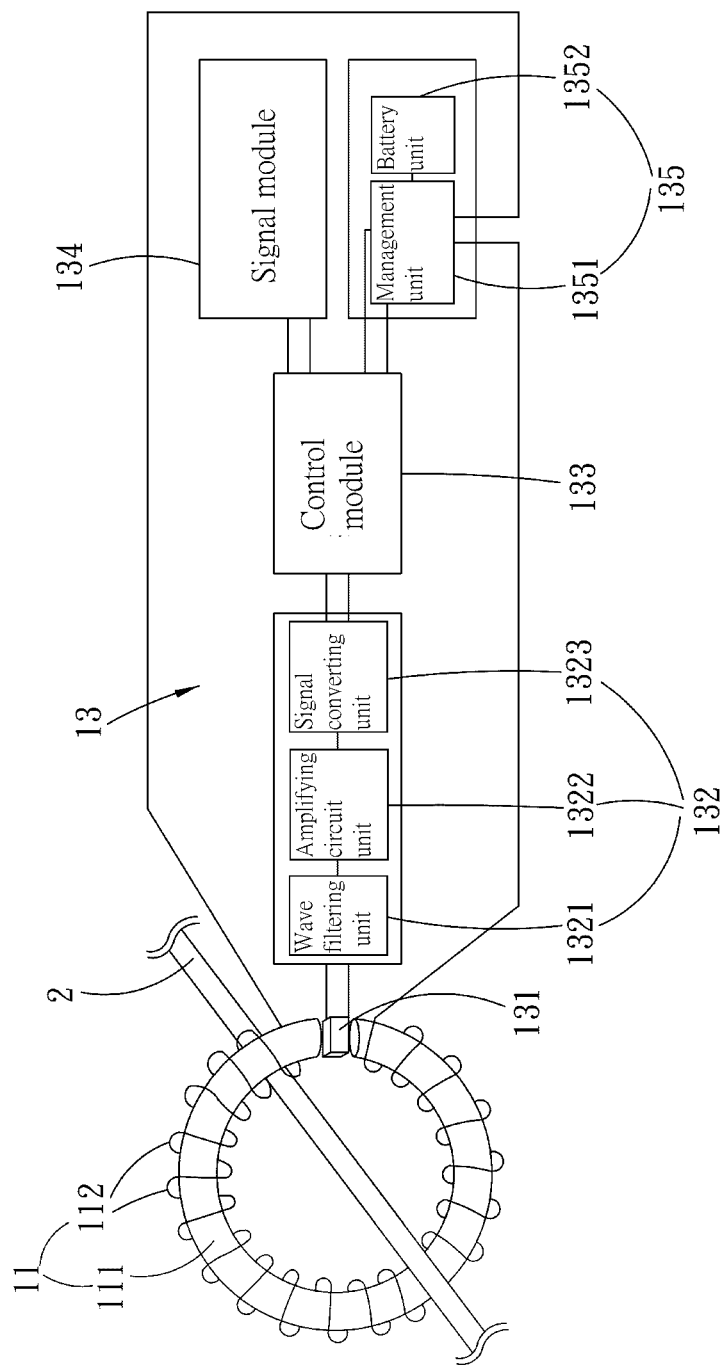
FIG. 3 is a schematic diagram of another circuit module of the first embodiment of the present disclosure.

FIG. 1 is a perspective view of a photovoltaic detection assembly of the first embodiment of the present disclosure. FIG. 2 is a schematic diagram of a circuit module of the first embodiment of the present disclosure. FIG. 3 is a schematic diagram of another circuit module of the first embodiment of the present disclosure. As shown in the figures, the present disclosure provides a photovoltaic detection assembly 1, which is disposed at a cable 2. The photovoltaic detection assembly 1 comprises a magnetic component 11 and a detection component 13. The magnetic component 11 comprises a magnetic ring 111 and a coil 112 winding around the magnetic ring 111. The magnetic ring 111 is sleeved on the cable 2 and comprises an opening 1110. Two end surfaces of the magnetic ring 111 are disposed on two sides of the opening 1110. The two end surfaces of the magnetic ring 111 are arranged in parallel. The detection component 13 comprises a Hall element 131, a detection module 132, a control module 133, a signal module 134, and a power module 135. The Hall element 131 is disposed at the opening 1110. The detection module 132 is electrically connected to the Hall element 131. The control module 133 is electrically connected to the detection module 132, the signal module 134, and the power module 135 respectively. The power module 135 is electrically connected to the coil 112.

In this embodiment, the photovoltaic detection assembly 1 is used to detect the cable 2 for low-voltage DC transmission in the solar photovoltaic power generation system. The cable 2 comprises a connection cable between solar cell modules, a connection cable between storage batteries, or a connection cable for an AC load. Besides, the magnetic ring 111 of the magnetic component 11 is a C-shaped ring, the coil 112 is spirally wound along the magnetic ring 111, the Hall element 131 is disposed at the opening 1110 of the magnetic ring 111, and the detection component 13 is disposed on two side surfaces of the magnetic component 11 through a circuit board. Wherein, the magnetic component 11 and a part of the detection component 13 form a Hall sensor. The Hall sensor is a magnetic field sensor made based on the Hall effect. The essence of the Hall effect is: when charge carriers of a solid material move in an external magnetic field, the trajectory is shifted by the Lorentz force and accumulates on two sides of the material to generate charges to form an electric field perpendicular to the electric current direction, the Lorentz force on the carriers is balanced with the repulsive force of the electric field, thereby establishing a stable potential difference on two sides of the material, which is the Hall voltage.

Hall sensors comprise open-loop sensors and closed-loop sensors. In this embodiment, the magnetic component 11 and a part of the detection component 13 form an open-loop Hall sensor. Wherein, the primary current goes through the photovoltaic cable 2 to generate a magnetic field around the cable 2, and the magnitude of this magnetic field is proportional to the primary current flowing through cable 2. The magnetic field generated by the cable 2 is gathered in the magnetic ring 111 and measured by the Hall element 131 at the opening 1110 of the magnetic ring 111. Moreover, the detection signal measured by the Hall element 131 can be collected by the detection module 132. The detection module 132 comprises a wave filtering unit 1321, an amplifying circuit unit 1322, and a signal converting unit 1323. The wave filtering unit 1321 is electrically connected to the Hall element 131, the amplifier circuit unit 1322 is electrically connected to the wave filtering unit 1321, the signal converting unit 1323 is electrically connected to the amplifying circuit unit 1322, and the control module 133 is electrically connected to the signal converting unit 1323. Wherein, since the potential difference (i.e., the data of the detection signal) generated by the Hall element 131 is quite small, the detection signal measured by the Hall element 131 needs to be converted into direct current by the wave filtering unit 1321, and the detection signal is amplified by the amplifying circuit unit 1322 when the voltage waveform is stabilized. Finally, through the signal converting unit 1323, the detected analog signal can be converted into a digital signal and input to the control module 133.

Further, the control module 133 determines that the detection signal is compared with the data of the detection signal in a normal state. If there is a difference between the detection signal and the detection signal in the normal state, the control module 133 would activate the signal module 134 to send a warning signal. When reporting the abnormal state detection signal and the location where the detection signal is sent to a central control system, users could send someone to repair the fault directly according to the content received by the central control system. If there is no difference between the detection signal and the detection signal in the normal state, no warning signal would be sent. Wherein, the signal module 134 is used for wireless signal transmission, where the wireless signal communication takes at least one of the methods of WI-FI communication, Bluetooth communication, ANT communication, RF4CE communication, Zigbee communication, NFC communication, UWB communication, and infrared communication.

Besides, the power module 135 comprises a management unit 1351 and a battery unit 1352, where the management unit 1351 is electrically connected to the coil 112 and the battery unit 1352, respectively. Since the magnetic effect of the current, a magnetic field would be generated around the current-carrying cable 2, and the current-carrying cable 2 passing through the magnetic component 11 would produce a current magnetic effect. In other words, the surrounding magnetic field of the coil 112 of the magnetic component 11 could be altered to generate an induced current in the coil 112. When the induced current is rectified and concentrated by the management unit 1351 of the power module 135, the current is input to the battery unit 1352 for charging. The management unit 1351 can also supply the power of the battery unit 1352 to the control module 133 to keep the detection in operation.

The photovoltaic detection assembly 1 in this embodiment further comprises a housing 15, which comprises a cover 151 and a casing 152. The casing 152 is sleeved on the cable 2 and comprises an accommodating groove 1521 surrounding the periphery of the cable 2. The magnetic component 11 and the detection component 13 are disposed in the accommodating groove 1521 of the casing 152, and the cover 151 covers an opening of the accommodating groove 1521. In this way, the casing 152 provides the magnetic component 11 and the detection component 13 with waterproof and dustproof functionality.

In this embodiment, the combination of the magnetic component 11 and the detection component 13 can be used as the Hall sensor to detect related current data in the cable 2. Besides, the magnetic component 11 can perform charging by the current magnetic effect and electromagnetic induction by the current in the cable 2 for supplying electric energy for the detection component 13. In this way, the photovoltaic detection assembly 1 can provide real-time monitoring and report detection results, as well as self-power supply to perform detection operation.

Figure 4:
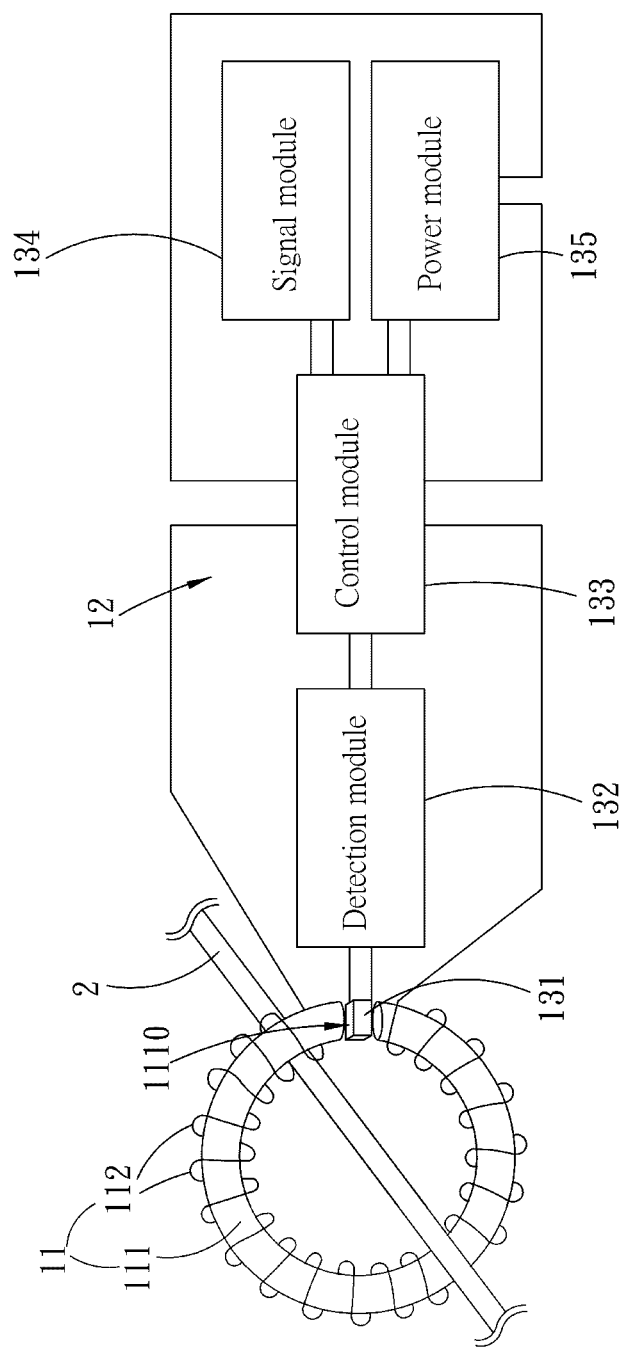
FIG. 4 is a schematic diagram of a circuit module of the second embodiment of the present disclosure.
Figure 5:
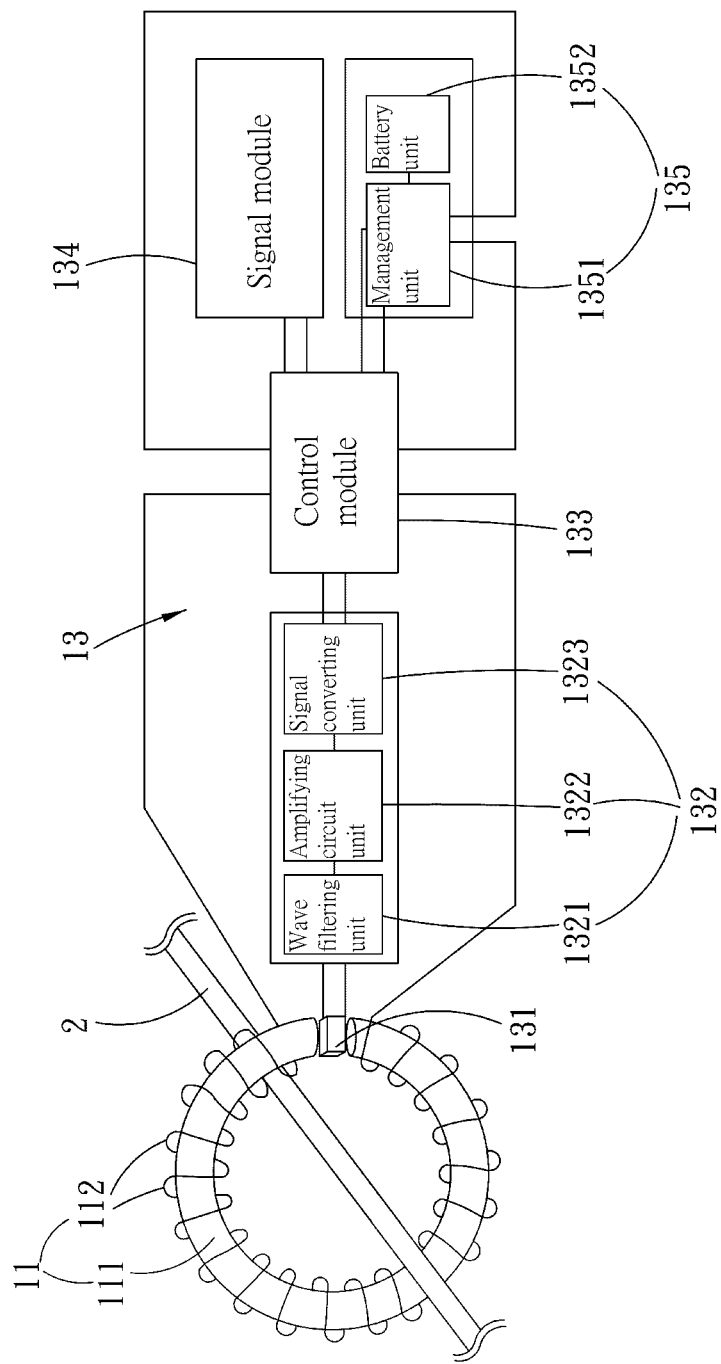
FIG. 5 is a schematic diagram of another circuit module of the second embodiment of the present disclosure.

FIG. 4 is a schematic diagram of a circuit module of the second embodiment of the present disclosure. FIG. 5 is a schematic diagram of another circuit module of the second embodiment of the present disclosure. As shown in the figures, the difference between this embodiment and the first embodiment lies in the electrical connection of the detection component 13. The detection component 13 comprises a Hall element 131, a detection module 132, a control module 133, a signal module 134, and a power module 135. The Hall element 131 is disposed at the opening 1110, the detection module 132 is electrically connected to the Hall element 131, and the control module 133 is electrically connected to the detection module 132, the signal module 134, the power module 135, and the coil 112 respectively.

The magnetic component 11 and a part of the detection component 13 form a closed-loop Hall sensor. Wherein, when magnetic flux generated by the primary current is concentrated through the magnetic component 11, the Hall element 131 could detect the magnetic flux at the opening 1110 of the magnetic ring 111, and further outputs a reverse compensation current through the multi-turn coil 112 winding on the magnetic ring 111 to cancel the magnetic flux generated by the primary current, keeping the magnetic flux in the magnetic component 11 always zero. So, through specific processing of circuit, an output end of the Hall element 131 of the closed-loop Hall sensor could output a current change that accurately reflects the primary current. Thus, compared with the coil 112 of the first embodiment, the coil 112 of this embodiment can further output a reverse compensation current.

In this embodiment, the control module 133 can control a closed-loop Hall sensor comprising the magnetic component 11 and the detection module 132 of the detection component 13 to detect the cable 2; or can control the current in the cable 2 through the combination of the magnetic component 11 and the power module 135 to perform charging by current magnetic effect and electromagnetic induction by the current in the cable 2. The above detection process or charging process is managed by the control module 133 to operate in turn.

Figure 6:
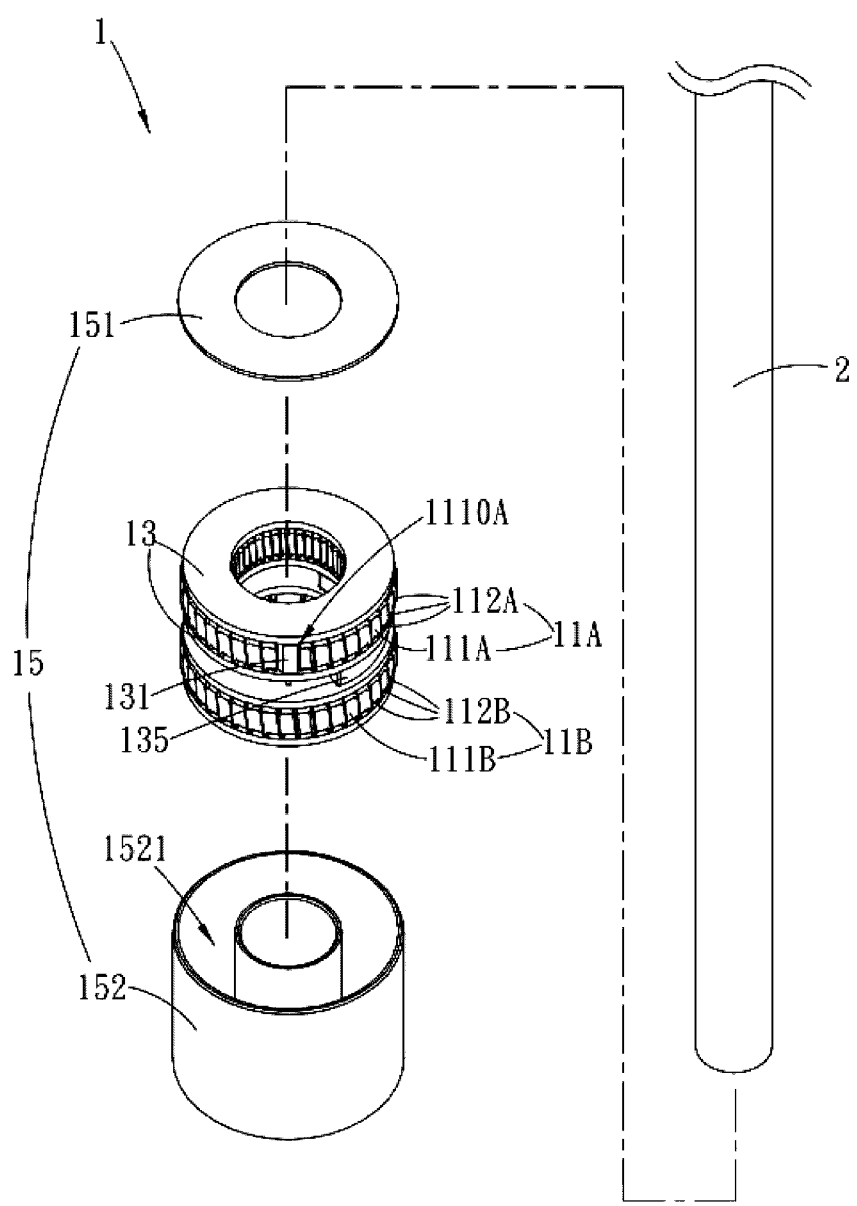
FIG. 6 is a perspective view of a photovoltaic detection assembly of the third embodiment of the present disclosure.
Figure 7:
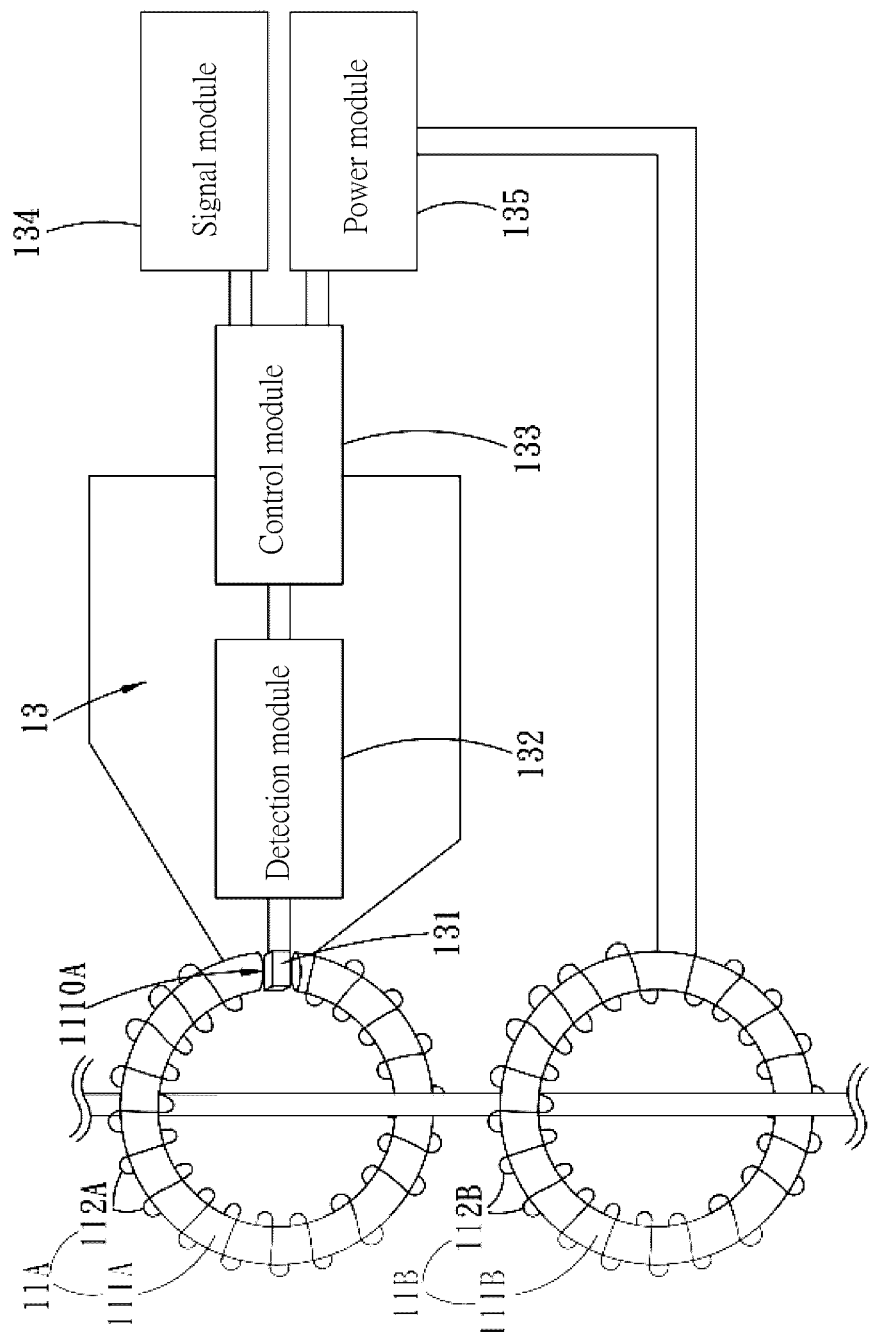
FIG. 7 is a schematic diagram of a circuit module of the third embodiment of the present disclosure.
Figure 8:
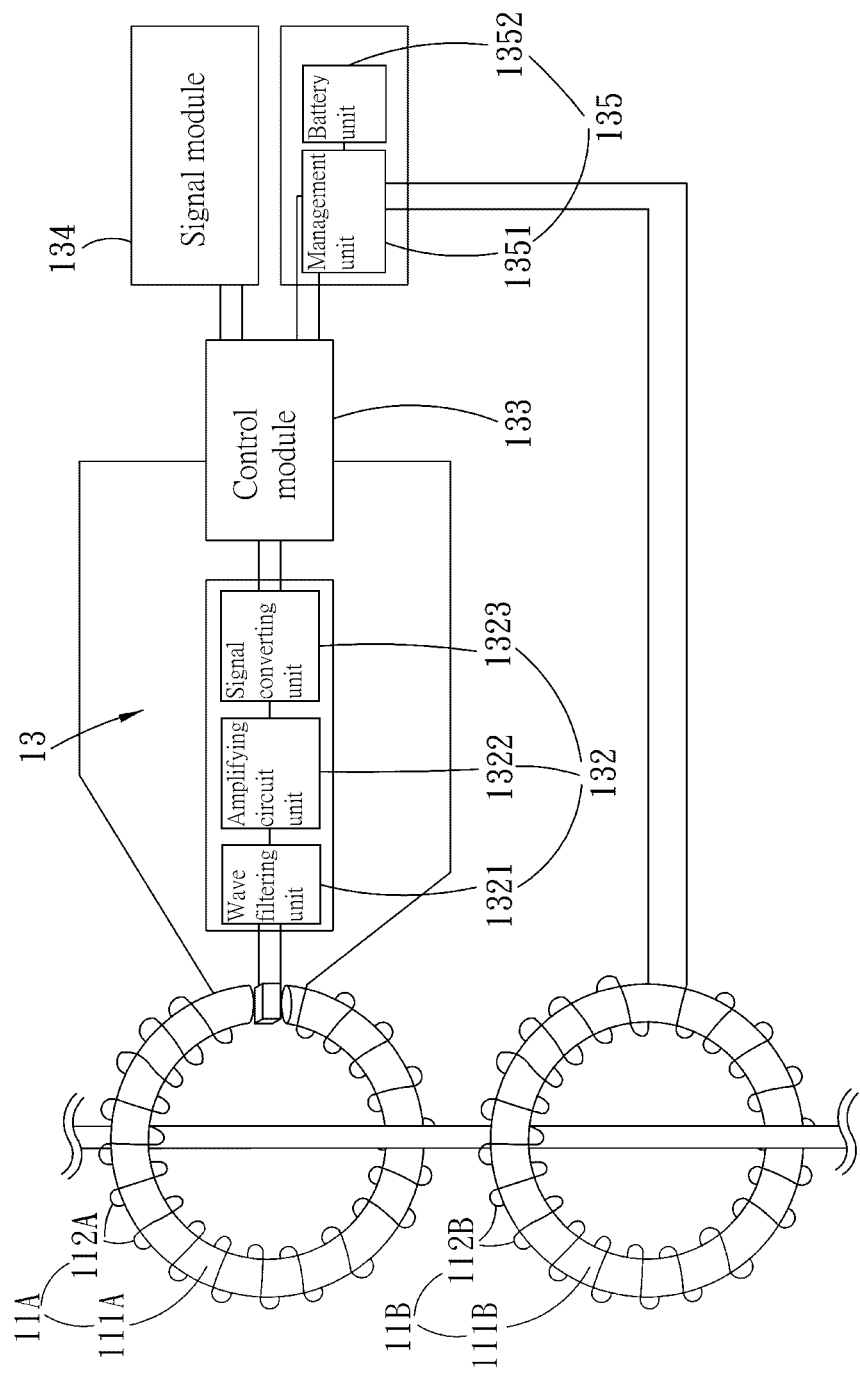
FIG. 8 is a schematic diagram of another circuit module of the third embodiment of the present disclosure.

FIG. 6 is a perspective view of a photovoltaic detection assembly of the third embodiment of the present disclosure. FIG. 7 is a schematic diagram of a circuit module of the third embodiment of the present disclosure. FIG. 8 is a schematic diagram of another circuit module of the third embodiment of the present disclosure. As shown in the figures, the difference between this embodiment and the second embodiment is that the power module 135 is charged by another magnetic component. In this embodiment, the photovoltaic detection assembly 1 comprises a first magnetic component 11A, a detection component 13, and a second magnetic component 11B. The first magnetic component 11A comprises a first magnetic ring 111A and a first coil 112A winding around the first magnetic ring 111A. The first magnetic ring 111A is sleeved on the cable 2 and comprises an opening 1110A. The detection component 13 comprises a Hall element 131, a detection module 132, a control module 133, a signal module 134, and a power module 135, where the Hall element 131 is disposed at the opening 1110A, the detection module 132 is electrically connected to the Hall element 131, and the control module 133 is electrically connected to the detection module 132, the signal module 134, the power module 135, and the first coil 112A, respectively. The second magnetic component 11B comprises a second magnetic ring 111B and a second coil 112B winding around the second magnetic ring 111B. The second magnetic ring 111B is sleeved on the cable 2, and the power module 135 is electrically connected to the second coil 112B.

The control module 133 controls a closed-loop Hall sensor comprising the first magnetic component 11A and the detection module 132 of the detection component 13 to detect the cable 2. Meanwhile, the control module 133 controls the combination of the second magnetic component 11B and the power module 135 to perform charging by current magnetic effect and electromagnetic induction by the current in the cable 2. The above detection process and the charging process would not mutually interfere.

Figure 9:
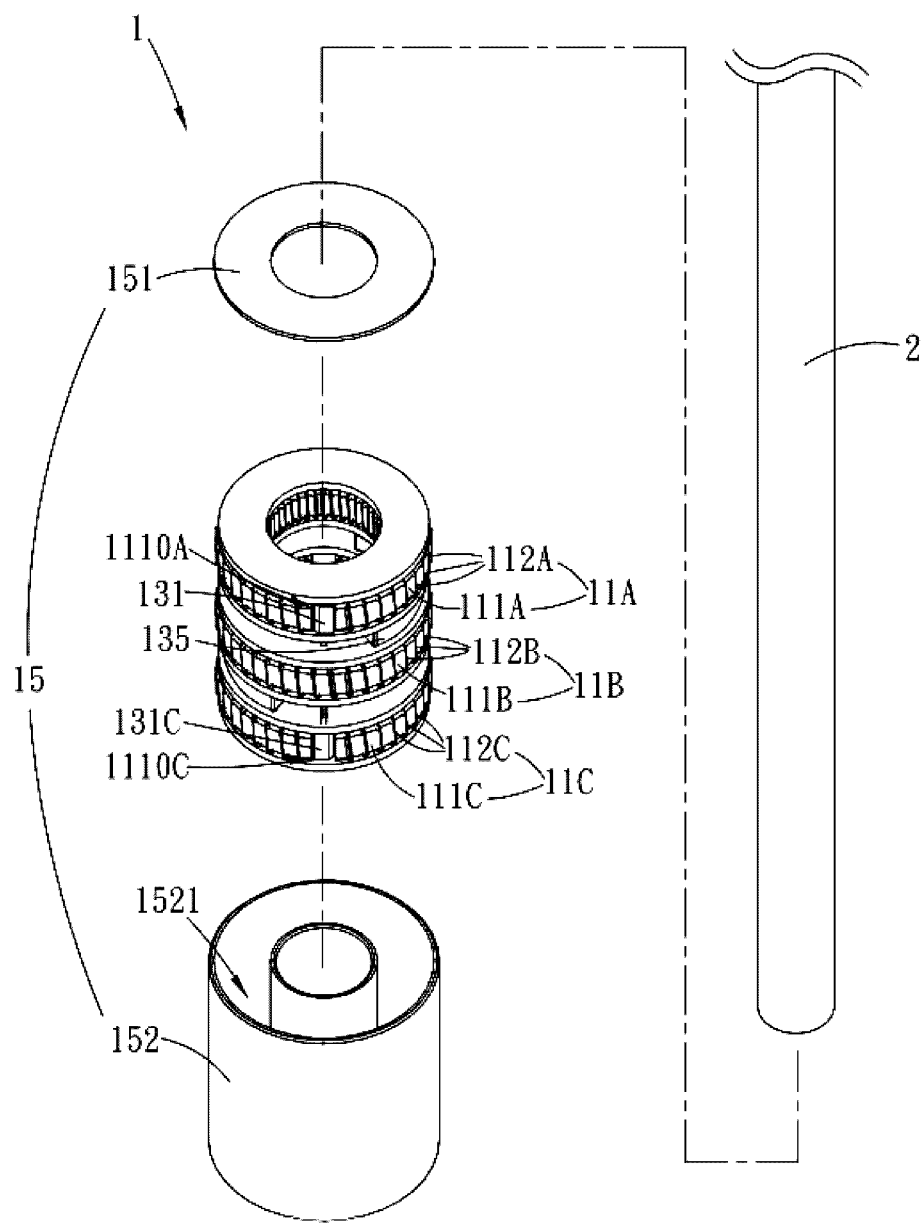
FIG. 9 is a perspective view of a photovoltaic detection assembly of the fourth embodiment of the present disclosure.
Figure 10:
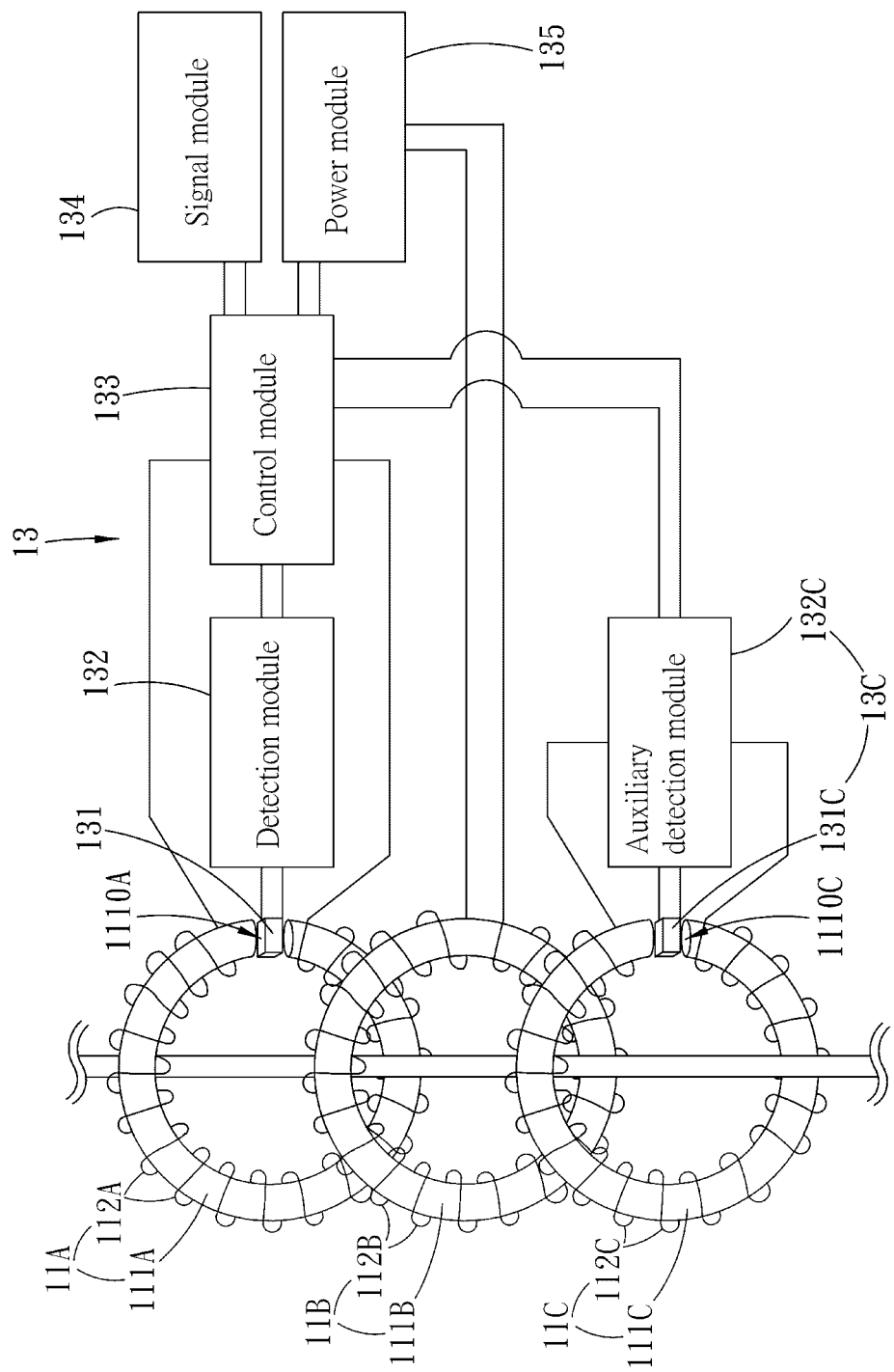
FIG. 10 is a schematic diagram of a circuit module of the fourth embodiment of the present disclosure.

FIG. 9 is a perspective view of a photovoltaic detection assembly of the fourth embodiment of the present disclosure. FIG. 10 is a schematic diagram of a circuit module of the fourth embodiment of the present disclosure. As shown in the figures, the difference between this embodiment and the third embodiment is that this embodiment further comprises a third magnetic component 11C, and an auxiliary detection component 13C. In this embodiment, the third magnetic component 11C comprises a third magnetic ring 111C and a third coil 112C winding around the third magnetic ring 111C. The third magnetic ring 111C is sleeved on the cable 2 and comprises an opening 1110C. The auxiliary detection component 13C comprises an auxiliary Hall element 131C and an auxiliary detection module 132C, where the auxiliary Hall element 131C is disposed at the opening 1110C of the third magnetic ring 111C, the auxiliary detection module 132C is electrically connected to the auxiliary Hall element 131C, and the control module 133 is electrically connected to the auxiliary detection module 132C. Wherein, the auxiliary detection module 132C also comprises a wave filtering unit, an amplifying circuit unit, and a signal converting unit, and thus would not be repeated herein.

In this embodiment, the combination of the first magnetic component 11A and the detection component 13 can be used as a Hall sensor to detect the current in the cable 2 to generate a first detection signal. The combination of the third magnetic component 11C and the auxiliary detection component 13C can also be used as a Hall sensor to detect the current in the cable 2 to generate a second detection signal. The control module 133 can compare the data of the first detection signal and the second detection signal. When a difference between the first detection signal and the second detection signal is detected, the control module 133 would activate the signal module 134 to send a warning signal. When there is no difference between the first detection signal and the second detection signal, no warning signal would be sent.

In summary, in the embodiments of the present disclosure, by providing a photovoltaic detection assembly having a design in a combination of magnetic component and detection component, which can be referred as a Hall sensor to detect related electric current data in the cable. Besides, the magnetic component can perform charging by electric current magnetic effect and electromagnetic induction by the electric current in the cable for supplying electric energy for the automatic operation for the detection component. Thus, the photovoltaic detection assembly could provide real-time monitoring and reporting of detection results, as well as the functions of autonomous power supply for detection operations.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A photovoltaic detection assembly disposed at a cable, comprising:
 a magnetic component comprising a magnetic ring and a coil winding around the magnetic ring, the magnetic ring being sleeved on the cable and comprising an opening;
 a detection component comprising a Hall element, a detection module, a control module, a signal module, and a power module, the Hall element being disposed at the opening, the detection module being electrically connected to the Hall element, the control module being electrically connected to the detection module, the signal module and the power module respectively, the power module being electrically connected to the coil;
 a third magnetic component comprising a third magnetic ring and a third coil winding around the third magnetic ring, the third magnetic ring being sleeved on the cable and comprising an opening; and
 an auxiliary detection component comprising an auxiliary Hall element and an auxiliary detection module, the auxiliary Hall element being disposed at the opening of the third magnetic ring, the auxiliary detection module being electrically connected to the auxiliary Hall element, the control module being electrically connected to the auxiliary detection module.

2. The photovoltaic detection assembly according to claim 1, wherein the power module comprises a management unit and a battery unit; the management unit is electrically connected to the coil and the battery unit respectively.

3. The photovoltaic detection assembly according to claim 1 comprising a housing sleeved on the cable, the magnetic component and the detection component being disposed in the housing.

4. The photovoltaic detection assembly according to claim 1, wherein the detection module comprises a wave filtering unit, an amplifying circuit unit, and a signal converting unit; the wave filtering unit is electrically connected to the Hall element; the amplifying circuit unit is electrically connected to the wave filtering unit; the signal converting unit is electrically connected to the amplifying circuit unit; the control module is electrically connected to the signal converting unit.

5. The photovoltaic detection assembly according to claim 1, wherein the signal module is used for wireless signal transmission; wherein, the wireless signal communication takes at least one of the methods of WI-FI communication, Bluetooth communication, ANT communication, RF4CE communication, Zigbee communication, NFC communication, UWB communication, and infrared communication.

6. A photovoltaic detection assembly disposed at a cable, comprising:
a magnetic component comprising a magnetic ring and a coil winding around the magnetic ring, the magnetic ring being sleeved on the cable and comprising an opening;
a detection component comprising a Hall element, a detection module, a control module, a signal module and a power module, the Hall element being disposed at the opening, the detection module being electrically connected to the Hall element, the control module being electrically connected to the detection module, the signal module, the power module, and the coil;
a third magnetic component comprising a third magnetic ring and a third coil winding around the third magnetic ring, the third magnetic ring being sleeved on the cable and comprising an opening; and
an auxiliary detection component comprising an auxiliary Hall element and an auxiliary detection module, the auxiliary Hall element being disposed at the opening of the third magnetic ring, the auxiliary detection module being electrically connected to the auxiliary Hall element, the control module being electrically connected to the auxiliary detection module.

7. The photovoltaic detection assembly according to claim 6, wherein the power module comprises a management unit and a battery unit; the management unit is electrically connected to the battery unit and the control module respectively.

8. A photovoltaic detection assembly disposed at a cable, comprising:
a first magnetic component comprising a first magnetic ring and a first coil winding around the first magnetic ring, the first magnetic ring being sleeved on the cable and comprising an opening;
a detection component comprising a Hall element, a detection module, a control module, a signal module and a power module, the Hall element being disposed at the opening, the detection module being electrically connected to the Hall element, the control module being electrically connected to the detection module, the signal module, the power module, and the first coil respectively;
a second magnetic component comprising a second magnetic ring and a second coil winding around the second magnetic ring, the second magnetic ring being sleeved on the cable, the power module being electrically connected to the second coil;
a third magnetic component comprising a third magnetic ring and a third coil winding around the third magnetic ring, the third magnetic ring being sleeved on the cable and comprising an opening; and
a auxiliary detection component comprising an auxiliary Hall element and an auxiliary detection module, the auxiliary Hall element being disposed at the opening of the third magnetic ring, the auxiliary detection module being electrically connected to the auxiliary Hall element, the control module being electrically connected to the auxiliary detection module.

9. The photovoltaic detection assembly according to claim 8, wherein the power module comprises a management unit and a battery unit; the management unit is electrically connected to the second coil and the battery unit respectively.

10. The photovoltaic detection assembly according to claim 8 comprising a housing sleeved on the cable, the first magnetic component, the detection component, and the second magnetic component being disposed in the housing.

* * * * *